(12) United States Patent
Motoori

(10) Patent No.: US 10,947,041 B2
(45) Date of Patent: Mar. 16, 2021

(54) TRANSPORT SYSTEM AND TRANSPORT METHOD

(71) Applicant: MURATA MACHINERY, LTD., Kyoto (JP)

(72) Inventor: Yoichi Motoori, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/625,961

(22) PCT Filed: Jun. 1, 2018

(86) PCT No.: PCT/JP2018/021167
§ 371 (c)(1),
(2) Date: Dec. 23, 2019

(87) PCT Pub. No.: WO2019/003799
PCT Pub. Date: Jan. 3, 2019

(65) Prior Publication Data
US 2020/0172333 A1 Jun. 4, 2020

(30) Foreign Application Priority Data
Jun. 30, 2017 (JP) .............................. JP2017-128570

(51) Int. Cl.
*B65G 1/04* (2006.01)
*H01L 21/677* (2006.01)

(52) U.S. Cl.
CPC ...... *B65G 1/0457* (2013.01); *H01L 21/67724* (2013.01); *H01L 21/67733* (2013.01); *H01L 21/67769* (2013.01)

(58) Field of Classification Search
CPC ...... B65G 1/0457; B65G 1/0421; B65G 1/04; B65G 1/0407; B65G 1/06; H01L 21/67724; H01L 21/67733; H01L 21/67736; H01L 21/67769; H01L 21/67727
See application file for complete search history.

(56) References Cited

U.S. PATENT DOCUMENTS

| 9,845,193 | B2 | 12/2017 | Yamamoto | |
|---|---|---|---|---|
| 2012/0305364 | A1* | 12/2012 | Morimoto | H01L 21/67727 198/370.01 |
| 2016/0272468 | A1* | 9/2016 | Izumi | B66C 9/02 |
| 2017/0283182 | A1* | 10/2017 | Maejima | H01L 21/67715 |

FOREIGN PATENT DOCUMENTS

WO 2017/029871 A1 2/2017

OTHER PUBLICATIONS

Official Communication issued in International Patent Application No. PCT/JP2018/021167, dated Aug. 21, 2018.

\* cited by examiner

*Primary Examiner* — Glenn F Myers
(74) *Attorney, Agent, or Firm* — Keating & Bennett, LLP

(57) ABSTRACT

A transport system includes first and second intrabay overhead tracks, first and second interbay overhead tracks, first and second storages, first and second delivery ports, first and second cranes including first and second runners that run along the first and second intrabay overhead tracks, respectively, first and second masts, and first and second transferors, and an overhead transport vehicle including a runner that runs along the first and second intrabay overhead tracks, a holder, a lifting driver, and a lateral extender.

5 Claims, 10 Drawing Sheets

TRANSPORT SYSTEM AND TRANSPORT METHOD

BACKGROUND OF THE INVENTION

1. Field of the Invention

The present invention relates to a transport system and a transport method.

2. Description of the Related Art

In manufacturing factories such as semiconductor manufacturing factories, in order to transport articles such as a FOUP storing a semiconductor wafer and a reticle Pod storing a reticle between a load port in a processing tool, a storage, and a delivery port, a configuration using an overhead transport vehicle that runs along a track placed on a ceiling and a crane that runs along a track placed on a floor differently from the track of the overhead transport vehicle has been proposed (see, for example, Japanese Patent No. 5880693).

The overhead transport vehicle and the crane disclosed in Japanese Patent No. 5880693 are both capable of accessing the load port, the storage, and the delivery port, but run on different tracks, and hence tracks on the ceiling and tracks on the floor need to be provided correspondingly to the overhead transport vehicle and the crane. Thus, it is costly to install the tracks, and space for installing each track is needed, and there is another problem in that the layout of processing tools is limited because installation positions of the processing tools or storages need to correspond to two tracks.

SUMMARY OF THE INVENTION

Preferred embodiments of the present invention provide transport systems and transport methods each capable of efficiently transporting an article by allocating different roles to an overhead transport vehicle and a crane by reducing installation costs of tracks by using tracks on which the overhead transport vehicle and the crane run in common.

A transport system according to a preferred embodiment of the present invention includes a first intrabay overhead track offset from immediately above a load port in a first processing tool and alongside the load port in the first processing tool, a second intrabay overhead track offset from immediately above a load port in a second processing tool and alongside the load port in the second processing tool, an interbay overhead track that connects the first intrabay overhead track and the second intrabay overhead track, first storages and second storages provided below and lateral to the first intrabay overhead track and the second intrabay overhead track, respectively, and positioned along a vertical direction in a plurality of stages to store therein an article, a first delivery port and a second delivery port provided below and lateral to the first intrabay overhead track and the second intrabay overhead track, respectively, a first crane including a first runner that runs along the first intrabay overhead track, a first mast that hangs down from the first runner, and a first transferor to be guided by the first mast and be raised and lowered, to transport an article between the load port in the first processing tool, the first storage, and the first delivery port, a second crane including a second runner that runs along the second intrabay overhead track, a second mast that hangs down from the second runner, and a second transferor to be guided by the second mast and be raised and lowered, to transport an article between the load port in the second processing tool, the second storage, and the second delivery port, and an overhead transport vehicle including a runner that runs along the first intrabay overhead track, the second intrabay overhead track, and the interbay overhead track, a holder that holds an article, a lifting driver that raises and lowers the holder while suspending the holder, and a lateral extender that controls the lifting driver to protrude laterally, to transport an article between the first delivery port and the second delivery port.

The crane may be a suspension crane. The first intrabay overhead track and the second intrabay overhead track may be circling tracks. The first crane and the overhead transport vehicle may circulate on the first intrabay overhead track in the same direction. The second crane and the overhead transport vehicle may circulate on the second intrabay overhead track in the same direction. The first delivery port and the second delivery port may be disposed at top stages of the first storages and the second storages, respectively.

A transport method according to a preferred embodiment of the present invention is a transport method for a transport system including a first intrabay overhead track offset from immediately above a load port in a first processing tool and alongside the load port in the first processing tool, a second intrabay overhead track offset from immediately above a load port in a second processing tool and alongside the load port in the second processing tool, an interbay overhead track that connects the first intrabay overhead track and the second intrabay overhead track, first storages and second storages provided below and lateral to the first intrabay overhead track and the second intrabay overhead track, respectively, and positioned along a vertical direction in a plurality of stages to store therein an article, a first delivery port and a second delivery port provided below and lateral to the first intrabay overhead track and the second intrabay overhead track, respectively, a first crane including a first runner that runs along the first intrabay overhead track, a first mast that hangs down from the first runner, and a first transferor to be guided by the first mast and be raised and lowered, a second crane including a second runner that runs along the second intrabay overhead track, a second mast that hangs down from the second runner, and a second transferor to be guided by the second mast and be raised and lowered, and an overhead transport vehicle including a runner that runs along the first intrabay overhead track, the second intrabay overhead track, and the interbay overhead track, a holder that holds an article, a lifting driver that raises and lowers the holder while suspending the holder, and a lateral extender that controls the lifting driver to protrude laterally. The transport method includes transporting, by the first crane, an article between the load port in the first processing tool, the first storage, and the first delivery port, transporting, by the second crane, an article between the load port in the second processing tool, the second storage, and the second delivery port, and transporting, by the overhead transport vehicle, an article between the first delivery port and the second delivery port.

With the transport systems and the transport methods according to preferred embodiments of the present invention, the transport of articles in a bay is performed by the first and the second cranes, and hence the number of stored articles is able to be increased, and the transport of articles between bays is performed by the overhead transport vehicle, and hence the interference with a facility below the overhead track is reduced or prevented. The intrabay overhead track is able to be shared by the first and the second cranes and the overhead transport vehicle while preventing the interference between the first and the second masts of the first and the second cranes that extend along the intrabay overhead track, the load port, the first and the second storages, and the first and the second delivery ports. Consequently, an overhead track corresponding thereto is not required to be provided separately, and the cost required to provide the overhead track is able to be reduced.

When the first and the second cranes are suspension cranes, tracks are not required to be provided on the ground side (floor side) corresponding to the first and the second cranes, and hence the tracks are able to be installed at low cost. When the first intrabay overhead track and the second intrabay overhead track are circling tracks, the first crane and the overhead transport vehicle circulate on the first intrabay overhead track in the same direction, and the second crane and the overhead transport vehicle circulate on the second intrabay overhead track in the same direction, the possibility that the overhead transport vehicle that has entered the intrabay overhead track from the interbay overhead track interferes with the first and the second cranes running along the intrabay overhead track is able to be reduced, and the control of the overhead transport vehicle and the first and the second cranes is able to be simplified. When the first and the second delivery ports are disposed at the top stages of the first and the second storages, articles are able to be transferred by both the overhead transport vehicle and the first and the second cranes, and articles are able to be easily delivered between the overhead transport vehicle and the first and the second cranes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described below with reference to the drawings. In each figure referred to below, directions in the figure are described by using an XYZ coordinate system. In the XYZ coordinate system, the vertical direction is a Z direction, and the horizontal directions are an X direction and a Y direction. The X direction is one direction of the horizontal directions and is a direction along a first interbay overhead track 13 and a second interbay overhead track 14 described later. The Y direction is a direction orthogonal to the X direction and is a direction along a straight line 11a of a first intrabay overhead track 11 and a straight line 12a of a second intrabay overhead track 12. Regarding the X, Y, and Z directions, the same side as the arrow is referred to as "+ side (for example, +X side) and the opposite side is referred to as "− side (for example, −X side)" as appropriate.

Figure 1:
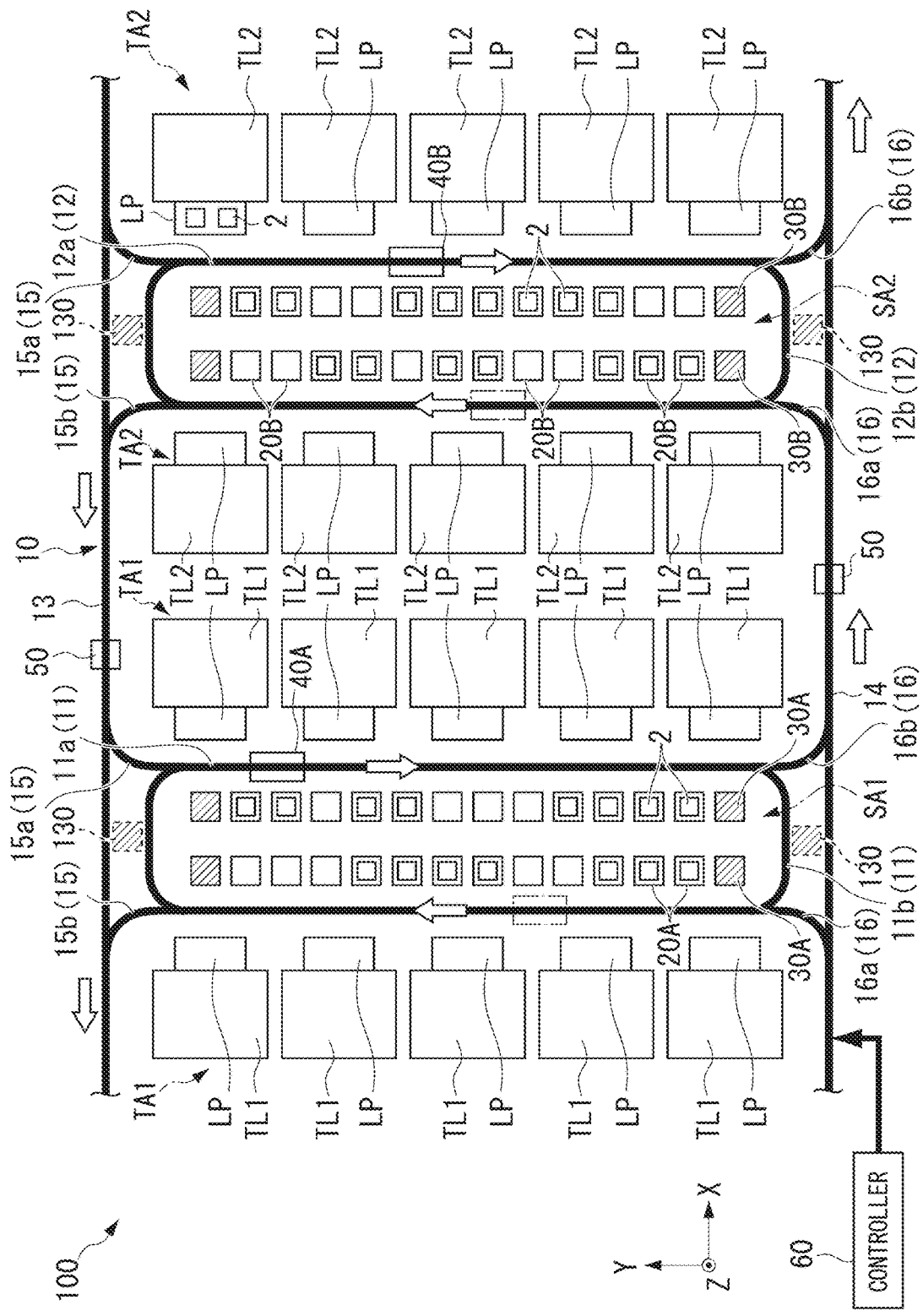
FIG. 1 is a plan view illustrating an example of a transport system according to a preferred embodiment of the present invention.

FIG. 1 is a plan view illustrating an example of a transport system 100 according to the present preferred embodiment. For example, the transport system 100 illustrated in FIG. 1 is installed in a semiconductor device manufacturing factory, and transports articles 2 such as a FOUP housing a semiconductor wafer used to manufacture semiconductor devices and a reticle pod housing a reticle. The present preferred embodiment is described by using an example where the article 2 is a FOUP, but the article 2 may be other than the FOUP. The transport system 100 is applicable to facilities other than the semiconductor manufacturing fields, and the articles 2 may be various kinds of articles treated in a facility where the transport system 100 is installed.

Figure 2:
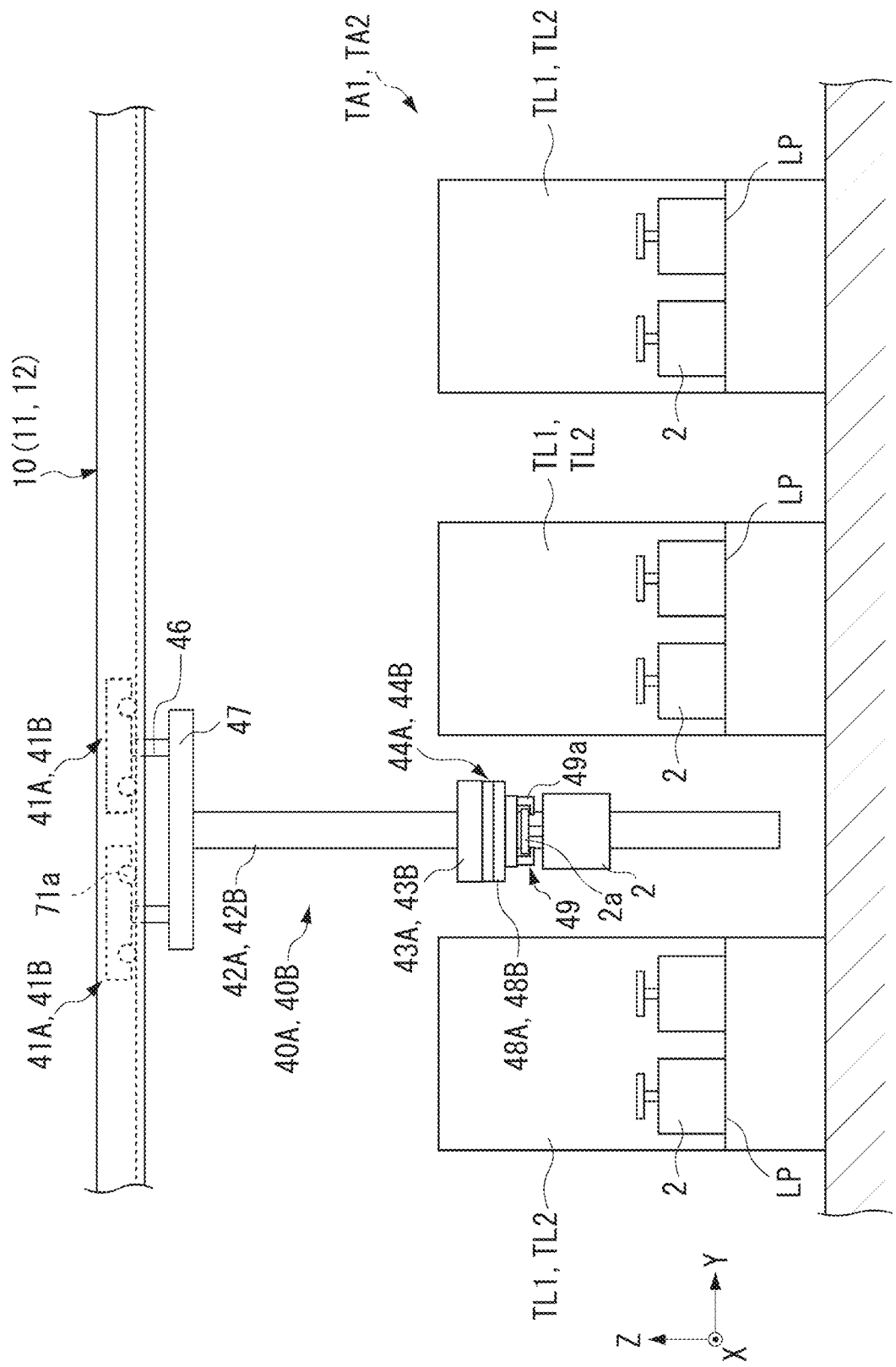
FIG. 2 is a diagram illustrating an example of first and second processing tools and a load port.

In the present preferred embodiment, the transport system 100 transports articles 2 between load ports LP in first and second processing tools TL1 and TL2 disposed in first and second tool areas TA1 and TA2 and first and second storages 20A and 20B and first and second delivery ports 30A and 30B described later. Examples of the first and the second processing tools TL1 and TL2 include an exposure device, a coater/developer, a film forming device, and an etching device, which perform various kinds of processing on a semiconductor wafer housed in an article 2 transported by the transport system 100. The first and the second processing tools TL1 and TL2 each include load ports LP at two locations. FIG. 2 is a diagram illustrating an example of the first and the second processing tools TL1 and TL2 and the load port LP. FIG. 2 illustrates an example where the first and the second processing tools TL1 and TL2 and the load ports LP are seen from the +X side.

As illustrated in FIG. 1 and FIG. 2, the first processing tools TL1 are disposed side by side in one direction (Y direction) in the first tool area TA1 set on the floor in a manufacturing factory. The second processing tools TL2 are disposed side by side in one direction (Y direction) in the second tool area TA2. The first and the second tool areas TA1 and TA2 are each provided in a plurality in the X direction. The first and the second processing tools TL1 and TL2 positioned along the Y direction are provided in the X direction in a plurality of rows. The arrangement of the first and the second processing tools TL1 and TL2 is an example, and may be another arrangement. The first and the second processing tools TL1 and TL2 are not limited to including the load ports LP at two locations and may include the load port LP at one location or three or more locations.

In a manufacturing factory, first and second storage areas SA1 and SA2 for temporarily storing articles 2 therein are disposed. The first storage area SA1 is provided correspondingly to the first processing tool TL1 and is disposed between two rows of the first processing tools TL1. The second storage area SA2 is provided correspondingly to the second processing tool TL2 and is disposed between two rows of the second processing tools TL2. In each row of the first and the second processing tools TL1 and TL2, the load ports LP are disposed on the side opposed to the first and the second storage areas SA1 and SA2, respectively.

As illustrated in FIG. 1, the transport system 100 includes an overhead track 10, the first and the second storages 20A and 20B, the first and the second delivery ports 30A and 30B, first and second cranes 40A and 40B, and an overhead transport vehicle 50. The overhead track 10 includes the first intrabay overhead track 11, the second intrabay overhead track 12, the first interbay overhead track 13, the second interbay overhead track 14, a first connection track 15, and a second connection track 16. The first interbay overhead track 13, the second interbay overhead track 14, the first connection track 15, and the second connection track 16 are interbay overhead tracks that connect the first intrabay overhead track 11 and the second intrabay overhead track 12. The first intrabay overhead track 11 is offset from immediately above a load port LP in the first processing tool TL1 and is provided alongside the load ports LP. The second intrabay overhead track 12 is offset from immediately above a load port LP in the second processing tool TL2 and is provided alongside the load ports LP. The first intrabay overhead track 11 is an orbiting track disposed circularly so as to surround the first storage area SA1, and the second intrabay overhead track 12 is an orbiting track disposed circularly so as to surround the second storage area SA2, but these tracks are not limited to this configuration.

The first intrabay overhead track 11 includes the straight lines 11a and circulation lines 11b. The straight line 11a is disposed immediately above the load ports LP in the Y direction alongside the load ports LP. In plan view, the straight line 11a is disposed between the first storage area SA1 and load ports LP disposed to be opposed across the first storage area SA1. The circulation lines 11b are disposed at both ends in the Y direction while including curved lines to connect the two straight lines 11a.

Similarly to the first intrabay overhead track 11, the second intrabay overhead track 12 includes the straight lines 12a and circulation lines 12b. The straight line 12a is disposed immediately above the load ports LP in parallel or substantially in parallel to the Y direction alongside the load ports LP. In plan view, the straight line 12a is disposed between the second storage area SA2 and load ports LP disposed to be opposed across the second storage area SA2. The circulation lines 12b are disposed at both ends in the Y direction while including curved lines to connect the two straight lines 12a. The present preferred embodiment is an example where the first intrabay overhead track and the second intrabay overhead track 12 have the same or substantially the same shape, but the first intrabay overhead track 11 and the second intrabay overhead track 12 may have different shapes.

The first interbay overhead track 13 and the second interbay overhead track 14 each extend linearly along the X direction. The first interbay overhead track 13 is connected to one end (end on +Y side) of the first intrabay overhead track 11 and the second intrabay overhead track 12 through the first connection track 15. The second interbay overhead track 14 is connected to the other end (end on −Y side) of the first intrabay overhead track 11 and the second intrabay overhead track 12 through the second connection track 16.

The first connection track 15 includes an entrance 15a and an exit 15b as two tracks. The entrance 15a defines a path used for the overhead transport vehicle 50 to run from the first interbay overhead track 13 to the first intrabay overhead track 11 or the second intrabay overhead track 12. The exit 15b defines a path used for the overhead transport vehicle 50 to run from the first intrabay overhead track 11 or the second intrabay overhead track 12 to the first interbay overhead track 13.

Similarly to the first connection track 15, the second connection track 16 includes an entrance 16a and an exit 16b as two tracks. The entrance 16a defines a path used for the overhead transport vehicle 50 to run from the second interbay overhead track 14 to the first intrabay overhead track 11 or the second intrabay overhead track 12. The exit 16b defines a path used for the overhead transport vehicle 50 to run from the first intrabay overhead track 11 or the second intrabay overhead track 12 to the second interbay overhead track 14. The present preferred embodiment is an example where the first connection track 15 and the second connection track 16 have the same or substantially the same shape, but the first connection track 15 and the second connection track 16 may have different shapes.

As illustrated in FIG. 1, the first storage 20A and the first delivery port 30A are disposed in the first storage area SA1. As illustrated in FIG. 1, the second storage 20B and the second delivery port 30B are disposed in the second storage area SA2. The first storage 20A and the first delivery port 30A are disposed below and lateral to the first intrabay overhead track 11. The second storage 20B and the second delivery port 30B are disposed below and lateral to the second intrabay overhead track 12. The first storage 20A and the first delivery port 30A are disposed in the range of the first intrabay overhead track 11 where articles 2 can be delivered from the first crane 40A described later and the overhead transport vehicle 50. The second storage 20B and the second delivery port 30B are disposed in the range of the second intrabay overhead track 12 where articles 2 can be delivered from the second crane 40B described later and the overhead transport vehicle 50.

Figure 3:
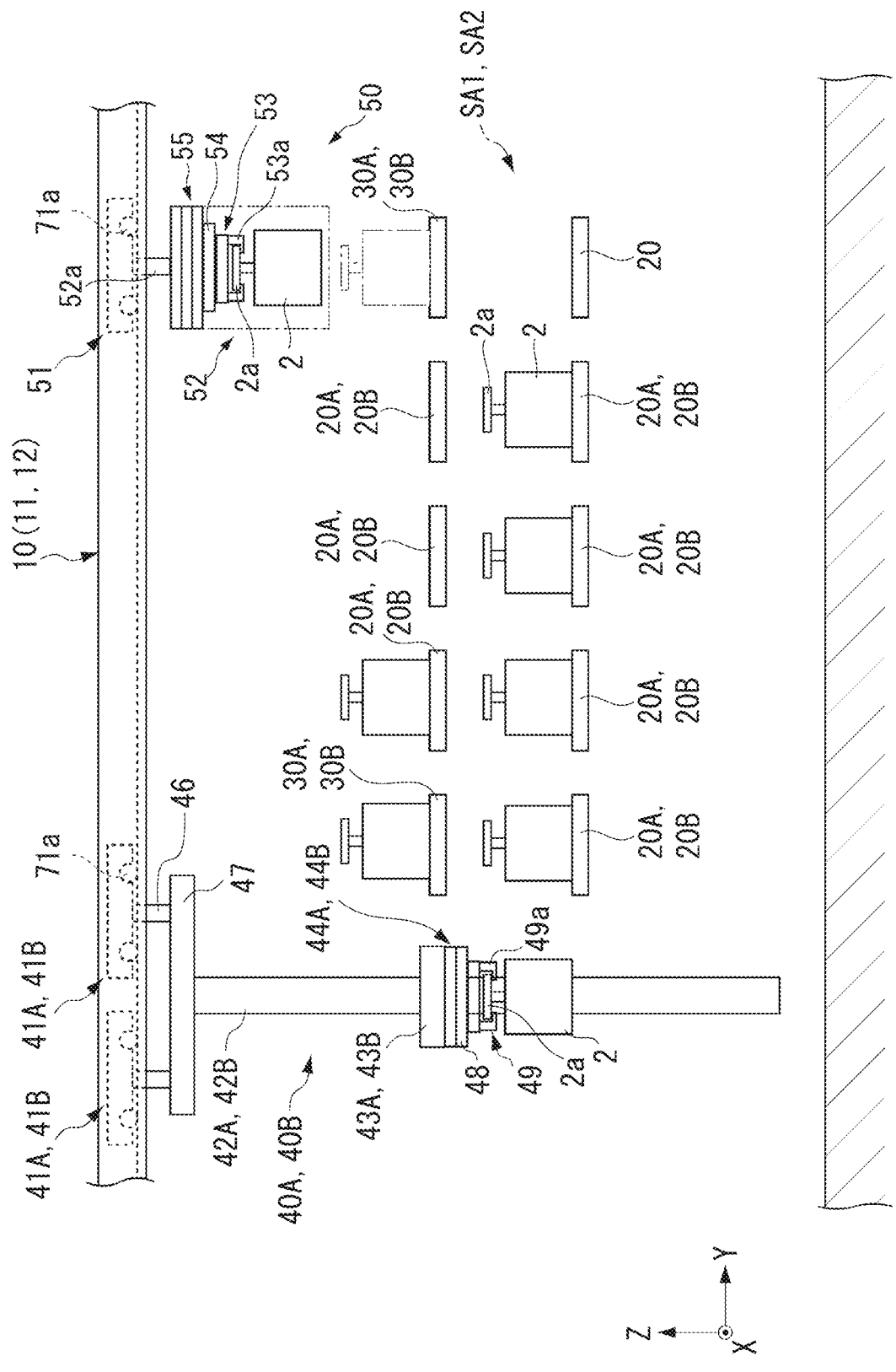
FIG. 3 is a diagram illustrating an example of first and second storages and first and second delivery ports.

FIG. 3 is a diagram illustrating an example of the first and the second storages 20A and 20B and the first and the second delivery ports 30A and 30B in the first and the second storage areas SA1 and SA2. FIG. 3 illustrates an example where the first and the second storages 20A and 20B and the first and the second delivery ports 30A and 30B are seen from the +X side. As illustrated in FIG. 3, shelves on which articles 2 can be placed are used for the first and the second storages 20A and 20B and the first and the second delivery ports 30A and 30B. The shelf that receives the article 2 placed thereon may be provided with a plurality of pins to be fitted into grooves provided in the bottom surface of the article 2. When the pins are fitted into the grooves in the article 2, the article 2 is positioned with respect to the shelf. For example, the first and the second storages 20A and 20B and the first and the second delivery ports 30A and 30B are supported while being suspended from a ceiling of a building. When the first and the second storages 20A and 20B and the first and the second delivery ports 30A and 30B are suspended from the ceiling, for example, an area below the first and the second storages 20A and 20B is able to be used as a path through which a worker can pass.

The first and the second storages 20A and 20B are disposed side by side in the Y direction alongside the load ports LP. The first and the second storages 20A and 20B are disposed in two rows in each of the first and the second storage areas SA1 and SA2. Each row of the first and the second storages 20A and 20B is disposed to be opposed to the row of the load ports LP in the X direction. The first storage 20A is disposed at a position offset in the X direction from immediately below the straight line 11a of the first intrabay overhead track 11. The second storage 20B is disposed at a position offset in the X direction from immediately below the straight line 12a of the second intrabay overhead track 12. In the first and the second storage areas SA1 and SA2, the first and the second storages 20A and 20B are provided in two stages in the vertical direction. The number of stages of the first and the second storages 20A and 20B is not limited to two and may be one or three or more. The first and the second storages 20A and 20B may be installed on the floor instead of being suspended from the ceiling.

The first delivery port 30A is provided in the row of the first storages 20A. The second delivery port 30B is provided in the row of the second storages 20B. The first and the second delivery ports 30A and 30B may have the same configuration as that of the first and the second storages 20A and 20B, and one or a plurality of the first and the second storages 20A and 20B are used as the first and the second delivery ports 30A and 30B. In the present preferred embodiment, among the first and the second storages 20A and 20B positioned along the vertical direction and the Y direction, two storages at the top stage and at both ends in the Y direction are used as the first and the second delivery ports 30A and 30B, and the other storages are used as the first and the second storages 20A and 20B. In FIG. 1, the first and the second delivery ports 30A and 30B are hatched. In this manner, by using the top stage of the first and the second storages 20A and 20B as the first and the second delivery ports 30A and 30B, the articles 2 can be delivered from both the overhead transport vehicle 50 and the first and the second cranes 40A and 40B. The first and the second delivery ports 30A and 30B are not limited to two storages at both ends in the Y direction, but all the first and the second storages 20A and 20B at the top stage can be used as the first and the second delivery ports 30A and 30B. The first and the second delivery ports 30A and 30B are not limited to the top stage of the first and the second storages 20A and 20B. For example, the first and the second delivery ports 30A and 30B may be provided separately from the first and the second storages 20A and 20B. For example, as illustrated in FIG. 1, in plan view, delivery ports 130 may be provided between the first interbay overhead track 13 and the first intrabay overhead track 11, between the second interbay overhead track 14 and the first intrabay overhead track 11, between the first interbay overhead track 13 and the second intrabay overhead track 12, and between the second interbay overhead track 14 and the second intrabay overhead track 12. The first and the second cranes 40A and 40B can deliver articles 2 to the delivery ports 130. The overhead transport vehicle 50 can deliver articles 2 to the delivery ports 130 from the first intrabay overhead track 11 or the second intrabay overhead track 12, and also deliver articles 2 to the delivery ports 130 from the first interbay overhead track 13 or the second interbay overhead track 14. As a result, the overhead transport vehicle 50 on the first interbay overhead track 13 or the second interbay overhead track 14 can deliver articles 2 to the first and the second cranes 40A and 40B through the delivery port 130 without entering the first intrabay overhead track 11 or the second intrabay overhead track 12.

Figure 4:
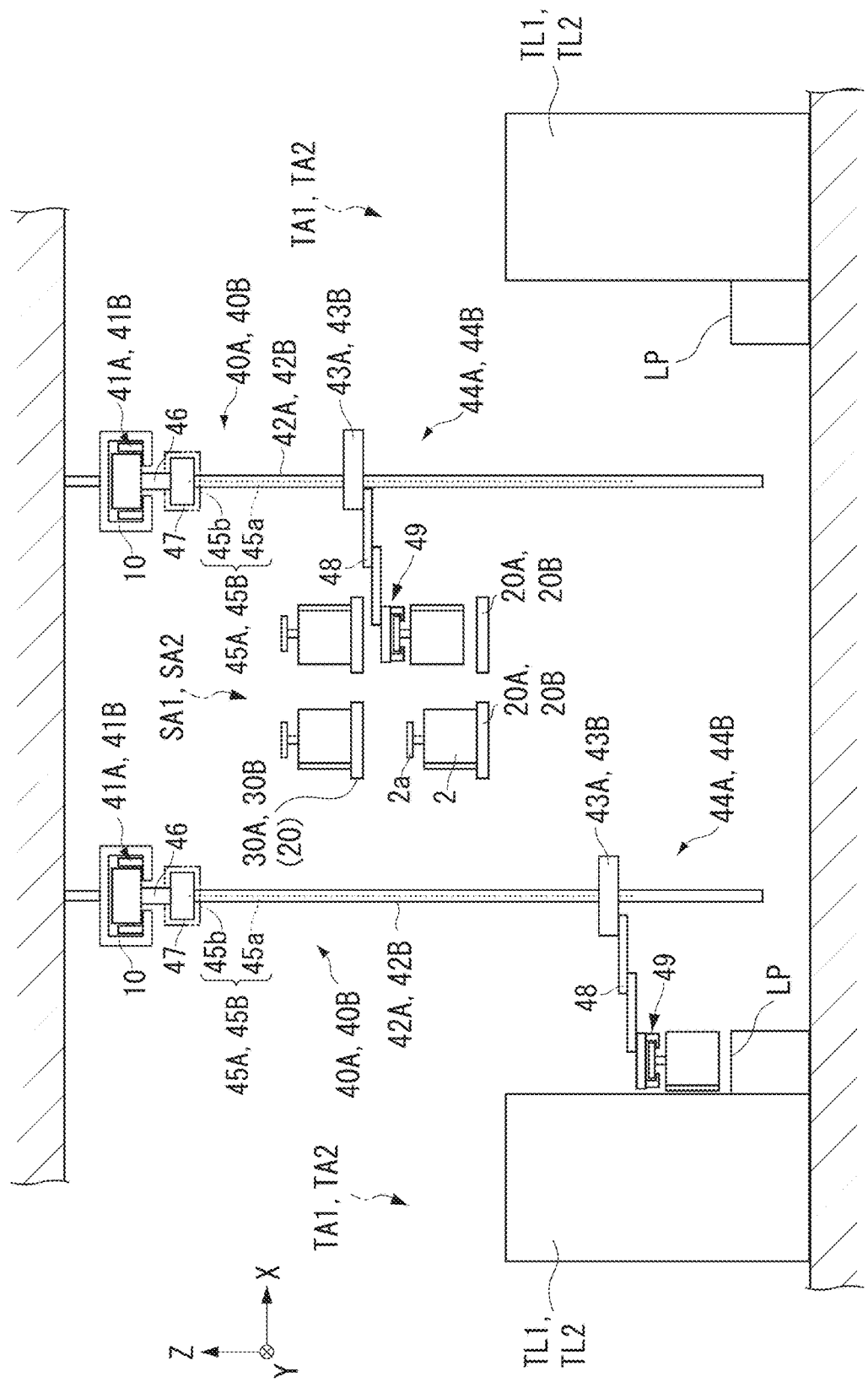
FIG. 4 is a diagram illustrating an example of a suspension crane.

The first crane 40A transports an article 2 in the first storage area SA1. The second crane 40B transports an article 2 in the second storage area SA2. FIG. 4 is a diagram illustrating an example of the first and the second cranes 40A and 40B. As illustrated in FIG. 4, suspension cranes are used for the first and the second cranes 40A and 40B. The first and the second cranes 40A and 40B are suspension cranes, and hence no tracks need to be provided on the ground side (floor side) corresponding to the first and the second cranes 40A and 40B, and hence tracks for the cranes can be installed at low cost. As illustrated in FIG. 4, the first and the second cranes 40A and 40B include first and second runners 41A and 41B, first and second masts 42A and 42B, and first and second transferors 44A and 44B, respectively. The first and the second transferors 44A and 44B include first and second lifting bases 43A and 43B, and first and second lifting drivers 45A and 45B.

The first runner 41A includes a running driver (not illustrated) and a plurality of wheels 71a (see FIG. 6) and runs along the first intrabay overhead track 11. The second runner 41B similarly includes a running driver (not illustrated) and a plurality of wheels 71a (see FIG. 6) and runs along the second intrabay overhead track 12. For example, the running driver may be an electric motor provided in the first or the second runner 41A or 41B to drive the wheels 71a or may be a linear motor provided by using the overhead track 10. The first runner 41A may run by entering the first interbay overhead track 13 or the second interbay overhead track 14 from the first intrabay overhead track 11. The second runner 41B may run by entering the first interbay overhead track 13 or the second interbay overhead track 14 from the second intrabay overhead track 12. This configuration enables the first and the second cranes 40A and 40B to easily move, as necessary, between the first intrabay overhead track 11 and the second intrabay overhead track 12 through the first interbay overhead track 13 or the second interbay overhead track 14.

The first and the second masts 42A and 42B hang down from the first and the second runners 41A and 41B to extend in the vertical direction and guide the first and the second lifting bases 43A and 43B. The first and the second masts 42A and 42B each have a hollow or solid rod shape, whose cross-section has a shape such as a circular shape, an oval shape, an elliptical shape, or a polygonal shape such as a rectangular shape. The lower ends of the first and the second masts 42A and 42B are set so as to be spaced away from the floor by a predetermined distance. In FIG. 4, upper supports 47 are mounted below the first and the second runners 41A and 41B through mounters 46. The first and the second masts 42A and 42B are mounted on the lower surface side of the upper supports 47 and are suspended from the first and the second runners 41A and 41B. For example, the first and the second masts 42A and 42B may be mounted to the upper supports 47 by using fasteners such as bolts and nuts or by welding. The numbers of each of the first and the second masts 42A and 42B may be one. Alternatively, for example, the first or the second masts 42A, 42B may be provided in front of and behind one another in the running direction of the first or the second runner 41A, 41B in the running direction, respectively.

The first and the second cranes 40A and 40B use two first and second runners 41A and 41B (see FIG. 2 and FIG. 3). The two first and second runners 41A and 41B are disposed side by side in the running direction and are connected by the upper support 47. The first and the second masts 42A and 42B are supported by the two first and second runners 41A and 41B. In this manner, the heavy first and second masts 42A and 42B are able to be reliably supported by the two first and second runners 41A and 41B. The first and the second cranes 40A and 40B are not limited to using the two first and second runners 41A and 41B and may use one or three or more first and second runners 41A and 41B. The first runner 41A of the first crane 40A can run by entering the interbay overhead track from the first intrabay overhead track 11. In other words, the first runner 41A can run by entering the first interbay overhead track 13 or the second interbay overhead track 14 from the first intrabay overhead track 11 through the first connection track 15 or the second connection track 16. The second runner 41B of the second crane 40B can run by entering the interbay overhead track from the second intrabay overhead track 12. In other words, the second runner 41B can run by entering the first interbay overhead track 13 or the second interbay overhead track 14 from the second intrabay overhead track 12 through the first connection track 15 or the second connection track 16. This configuration enables the first and the second cranes 40A and 40B to easily move, as necessary, between the first intrabay overhead track 11 and the second intrabay overhead track 12 through the first interbay overhead track 13 or the second interbay overhead track 14.

The first and the second transferors 44A and 44B are mounted on the lower surface side of the first and the second lifters 43A and 43B, and the first and the second lifters 43A and 43B can rise and lower by being guided by the first and the second masts 42A and 42B. The first and the second lifters 43A and 43B include guide rollers (not illustrated) to be brought into contact with the surfaces of the first and the second masts 42A and 42B and perform smooth rising and lowering operation along the first and the second masts 42A and 42B. Lower supports (not illustrated) are provided at the lower portion of the first and the second masts 42A and 42B, and the first and the second lifting bases 43A and 43B can lower to positions contacting the lower supports. The lower supports prevent the first and the second lifting bases 43A and 43B from falling off the first and the second masts 42A and 42B downward.

The first and the second transferors 44A and 44B each include an arm 48 that can elongate in a direction orthogonal to the running direction of the first and the second runners 41A and 41B, and a holder 49 provided at the distal end of the arm 48 to hold an article 2. The holder 49 grips a flange 2a of the article 2 to hold the article 2 while suspending the article 2. For example, the holder 49 is a chuck including a claw 49a capable of moving in the horizontal direction, and when the claw 49a is caused to enter below the flange 2a of the article 2 and the holder 49 is raised, the holder 49 holds the article 2 while suspending the article 2.

When receiving an article 2, the first or the second transferor 44A or 44B extends the arm 48 and the holder 49 is disposed above the article 2, and the first or the second lifting base 43A or 43B is raised with the claw 49a holding the flange 2a, thereby pulling up the article 2 by the holder 49. Subsequently, the first or the second transferor 44A or 44B contracts the arm 48 with the holder 49 holding the article 2, and the holder 49 holding the article 2 is disposed below the first or the second lifting base 43A or 43B. The first and the second transferors 44A and 44B are not limited to the above-mentioned configuration. For example, the holder 49 may place an article 2 thereon, or the holder 49 may grip the side surface of an article 2 to hold the article 2.

For example, hoists are used for the first and the second lifting drivers 45A and 45B and raise and lower the first and the second lifting bases 43A and 43B along the first and the second masts 42A and 42B. The first and the second lifting drivers 45A and 45B each include a suspender 45a and a driver 45b. For example, the suspender 45a may be a belt or a wire, and the first and the second lifting bases 43A and 43B are suspended from the upper supports 47 by the suspenders 45a. The driver 45b is provided to the upper support 47, and feeds and winds the suspender 45a. When the driver 45b feeds the suspender 45a, the first or the second lifting base 43A or 43B is guided by the first or the second mast 42A or 42B to be lowered. When the driver 45b winds the suspender 45a, the first or the second lifting base 43A or 43B is guided by the first or the second mast 42A or 42B to be raised. The driver 45b is controlled by the controller 60 to lower or raise the first or the second lifting base 43A or 43B at predetermined speed. The driver 45b is controlled by the controller 60 to hold the first or the second lifting base 43A or 43B at a target height.

The first and the second lifting drivers 45A and 45B are provided in the upper supports 47 (first and second runners 41A and 41B) but are not limited to this configuration. For example, the first and the second lifting drivers 45A and 45B may be provided to the first and the second lifting bases 43A and 43B. As a configuration in which the first and the second lifting drivers 45A and 45B are provided to the first and the second lifting bases 43A and 43B, for example, a belt or a wire suspended from the upper support 47 may be wound or fed by a hoist mounted on the first or the second lifting base 43A or 43B to raise or lower the first or the second lifting base 43A or 43B. An electric motor that drives a pinion gear may be mounted on the first or the second lifting base 43A or 43B, a rack to be engaged with the pinion gear may be provided in the first or the second mast 42A or 42B, and the electric motor may be driven to rotate the pinion gear to raise or lower the first or the second lifting base 43A or 43B.

As illustrated in FIG. 4, the first and the second cranes 40A and 40B transport articles 2 between the load ports LP in the first and the second processing tools TL1 and TL2, the first and the second storages 20A and 20B, and the first and the second delivery ports 30A and 30B. The first and the second cranes 40A and 40B transport articles 2 from the current first and second storages 20A and 20B to other first and second storages 20A and 20B. For example, the first and the second cranes 40A and 40B transport articles 2 from the first and the second storages 20A and 20B at the lower stage to the first and the second storages 20A and 20B at the upper stage.

The overhead transport vehicle 50 moves along the overhead track 10 (first intrabay overhead track 11, second intrabay overhead track 12, first interbay overhead track 13, and second interbay overhead track 14), and delivers articles 2 between the load ports LP in the first and the second processing tools TL1 and TL2, the first and the second storages 20A and 20B, and the first and the second delivery ports 30A and 30B.

Figure 5:
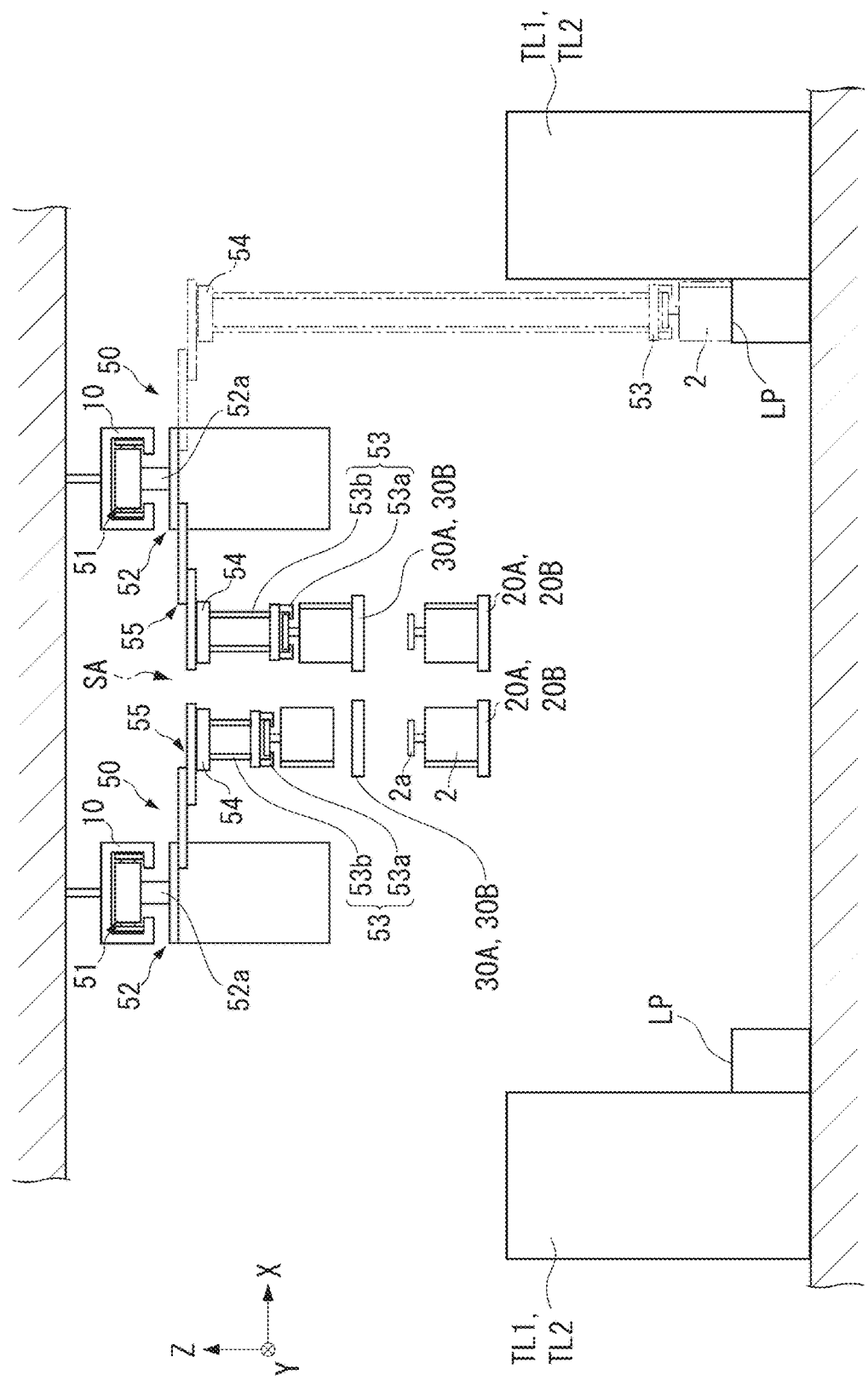
FIG. 5 is a diagram illustrating an example of an overhead transport vehicle.

FIG. 5 is a diagram illustrating an example of the overhead transport vehicle 50. As illustrated in FIG. 5, the overhead transport vehicle 50 includes a runner 51 and a main body 52. Similarly to the first and the second runners 41A and 41B, the runner 51 includes a running driver (not illustrated) and a plurality of wheels 71a (see FIG. 6) and runs along the overhead track 10. For example, the running driver may be an electric motor provided in the runner 51 to drive the wheels 71a or may be a linear motor provided by using the overhead track 10.

The main body 52 is mounted to the lower portion of the runner 51 through a mounter 52a. The main body 52 includes a holder 53 that holds an article 2, a lifting driver 54 that suspends the holder 53 to raise and lower the holder 53, and a lateral extender 55 that moves the lifting driver 54. The holder 53 grips the flange 2a of the article 2 to hold the article 2 while suspending the article 2. For example, the holder 53 is a chuck including a claw 53a capable of moving in the horizontal direction, and when the claw 53a is caused to enter below the flange 2a of the article 2 and the holder 53 is raised, the holder 53 holds the article 2. The holder 53 is connected to a suspender 53b such as a wire or a belt. The holder 53 rises and lowers so as to be slidable while being suspended from the lifting driver 54. The holder 53 may have the same configuration as the above-mentioned holders 49 of the first and the second cranes 40A and 40B or may have a different configuration.

For example, the lifting driver 54 is a hoist, and feeds the suspender 53b to lower the holder 53 and winds the suspender 53b to raise the holder 53. The lifting driver 54 is controlled by the controller 60 to lower or raise the holder 53 at a predetermined speed. The lifting driver 54 is controlled by the controller 60 to hold the holder 53 at a target height.

For example, the lateral extender 55 includes movable plates disposed so as to overlap in the vertical direction. The movable plates are movable lateral to the running direction of the runner 51 (direction orthogonal to running direction). A rotator and the lifting driver 54 are mounted to the movable plate. The main body 52 includes a guide (not illustrated) that guides the lateral extender 55 and a driver (not illustrated) that drives the lateral extender 55. The lateral extender 55 moves the lifting driver 54 and the holder 53 along the guide between a protruding position and a storage position by driving power from the driver such as an electric motor. The protruding position is a position protruding laterally from the main body 52. The storage position is a position in the main body 52.

The rotator includes a turner and a turning driver (not illustrated). The turner is provided so as to be turnable about the axis in the vertical direction. The turner is mounted to the lifting driver 54 or the holder 53. The turning driver uses an electric motor and turns the turner about the axis in the vertical direction. The rotator turns by driving power from the turning driver and can turn the lifting driver 54 or the holder 53 about the axis in the vertical direction. The rotator can change the orientation of an article 2 held by the holder 53. The overhead transport vehicle 50 is not necessarily required to include the rotator.

Figure 6:
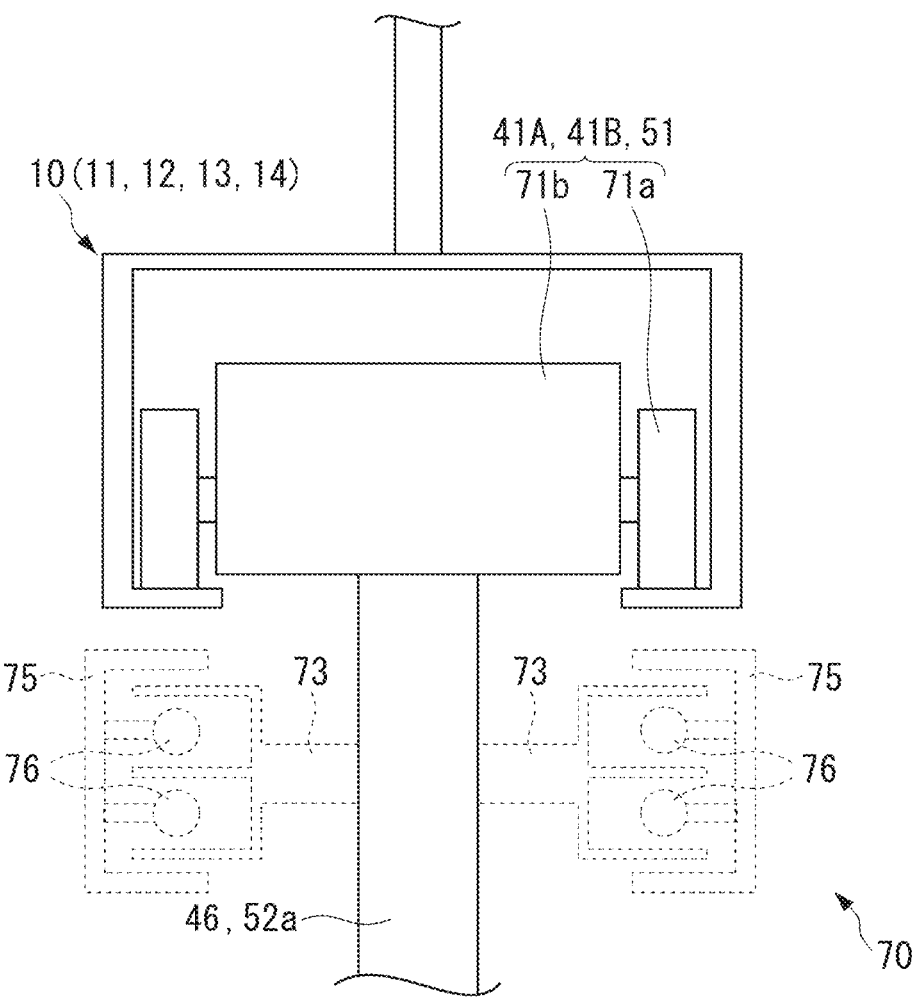
FIG. 6 is a diagram illustrating an example of first and second runners of first and second cranes and a runner of the overhead transport vehicle.

FIG. 6 is a diagram illustrating an example of the first and the second runners 41A and 41B and the runner 51. For example, the first and the second runners 41A and 41B and the runner 51 may have a common configuration (the same or substantially the same configuration or structure). Cross-sections of the first intrabay overhead track 11, the second intrabay overhead track 12, the first interbay overhead track 13, and the second interbay overhead track in the overhead track 10 in planes perpendicular or substantially perpendicular to the running directions thereof, respectively, are identical or substantially identical to each other, and all the first and the second runners 41A and 41B and the runner 51 can run thereon. In this manner, the first and the second runners 41A and 41B and the runner 51 are common, and hence the first and the second runners 41A and 41B and the runner 51 do not need to be manufactured by separate configurations, and the manufacturing costs of the first and the second cranes 40A and 40B and the overhead transport vehicle 50 are able to be reduced.

The first and the second runners 41A and 41B and the runner 51 include a plurality of wheels 71a in contact with the lower inner surface of the overhead track 10, and a runner main body 71b to which the wheels 71a are mounted. The runner main body 71b includes a running driver that drives the wheels 71a, and various kinds of sensors. The overhead track 10 includes a power supply 70. The power supply 70 includes a power supply rail 75 and a non-contact power feeder 76 provided to the power supply rail 75. The power supply 70 is disposed below the overhead track and is continuously or discontinuously provided along the overhead track 10. A power receiver 73 is provided to the mounter 46 of the first and the second cranes 40A and 40B and the mounter 52a of the overhead transport vehicle 50. The power receiver 73 receives power through the non-contact power feeder 76, and supplies power to the runner main body 71b.

As illustrated in FIG. 1, the controller 60 comprehensively controls the transport system 100. The controller 60 controls the operations of the first and the second cranes 40A and 40B and the overhead transport vehicle 50 by wireless or wired communication. The controller 60 may be divided into a controller that controls the first and the second cranes 40A and 40B and a controller that controls the overhead transport vehicle 50. The first crane 40A and the second crane 40B may be controlled by different controllers.

In the above-mentioned transport system 100, the first crane 40A transports an article 2 in the first storage area SA1. For example, the first crane 40A runs in one direction along the first intrabay overhead track 11, for example, a clockwise direction in FIG. 1, and transports an article 2 between the load port LP in the first processing tool TL1, the first storage 20A, and the first delivery port 30A. The second crane 40B transports an article 2 in the second storage area SA2. For example, the second crane 40B runs in one direction along the second intrabay overhead track 12, for example, a clockwise direction in FIG. 1, and transports an article 2 between the load port LP in the second processing tool TL2, the second storage 20B, and the second delivery port 30B. For example, when an article 2 is placed on the first delivery port 30A or the second delivery port 30B by the overhead transport vehicle 50, the first crane 40A can move to the first delivery port 30A to receive the article 2 through the first transferor 44A (see FIG. 4), and the second crane 40B can move to the second delivery port 30B to receive the article 2 through the second transferor 44B (see FIG. 4).

After that, the first crane 40A can run to the load port LP in the first processing tool TL1 or the first storage 20A, and place an article 2 onto the load port LP in the first processing tool TL1 or the first storage 20A. The first crane 40A can receive an article 2 stored in the first storage 20A through the first transferor 44A, run to the load port LP in the first processing tool TL1 or the first delivery port 30A, and place the article 2 onto the load port LP in the first processing tool TL1 or the first delivery port 30A through the first transferor 44A. The second crane 40B can run to the load port LP in the second processing tool TL2 or the second storage 20B, and place an article 2 onto the load port LP in the second processing tool TL2 or the second storage 20B. The second crane 40B can receive an article 2 stored in the second storage 20B through the second transferor 44B, run to the load port LP in the second processing tool TL2 or the second delivery port 30B, and place the article 2 onto the load port LP in the second processing tool TL2 or the second delivery port 30B through the second transferor 44B. The first and the second cranes 40A and 40B can transport articles 2 between the upper and lower first and second storages 20A and 20B. In the case where an article 2 is placed on the first delivery port 30A by the overhead transport vehicle 50, when the article 2 can be transported to a load port LP in a first processing tool TL1 at a transport destination, the first crane 40A transports the article 2 to the load port LP, and when the article 2 cannot be transported to the load port LP at the transport destination, the first crane 40A transports the article 2 to the first storage 20A, and transports the article 2 to the load port LP in the first processing tool TL1 at the transport destination from the first storage 20A at the time when the article 2 can be transported. In the case where an article 2 is placed on the second delivery port 30B by the overhead transport vehicle 50, when the article 2 can be transported to a load port LP in a second processing tool TL2 at a transport destination, the second crane 40B transports the article 2 to the load port LP, and when the article 2 cannot be transported to the load port LP at the transport destination, the second crane 40B transports the article 2 to the second storage 20B, and transports the article 2 to the load port LP in the second processing tool TL2 at the transport destination from the second storage 20B at the time when the article 2 can be transported.

In the transport system 100, the overhead transport vehicle 50 transports articles 2 between different first storage areas SA1 and second storage areas SA2. The running speed of the overhead transport vehicle 50 is set higher than those of the first and the second cranes 40A and 40B. As a result, articles 2 can be transported by the overhead transport vehicle 50 even between first and second storage areas SA1 and SA2 at a distance in a short period of time. The running speeds of the first and the second cranes 40A and 40B and the overhead transport vehicle 50 can be freely set, and the first and the second cranes 40A and 40B and the overhead transport vehicle 50 may have the same running speed.

Figure 7:
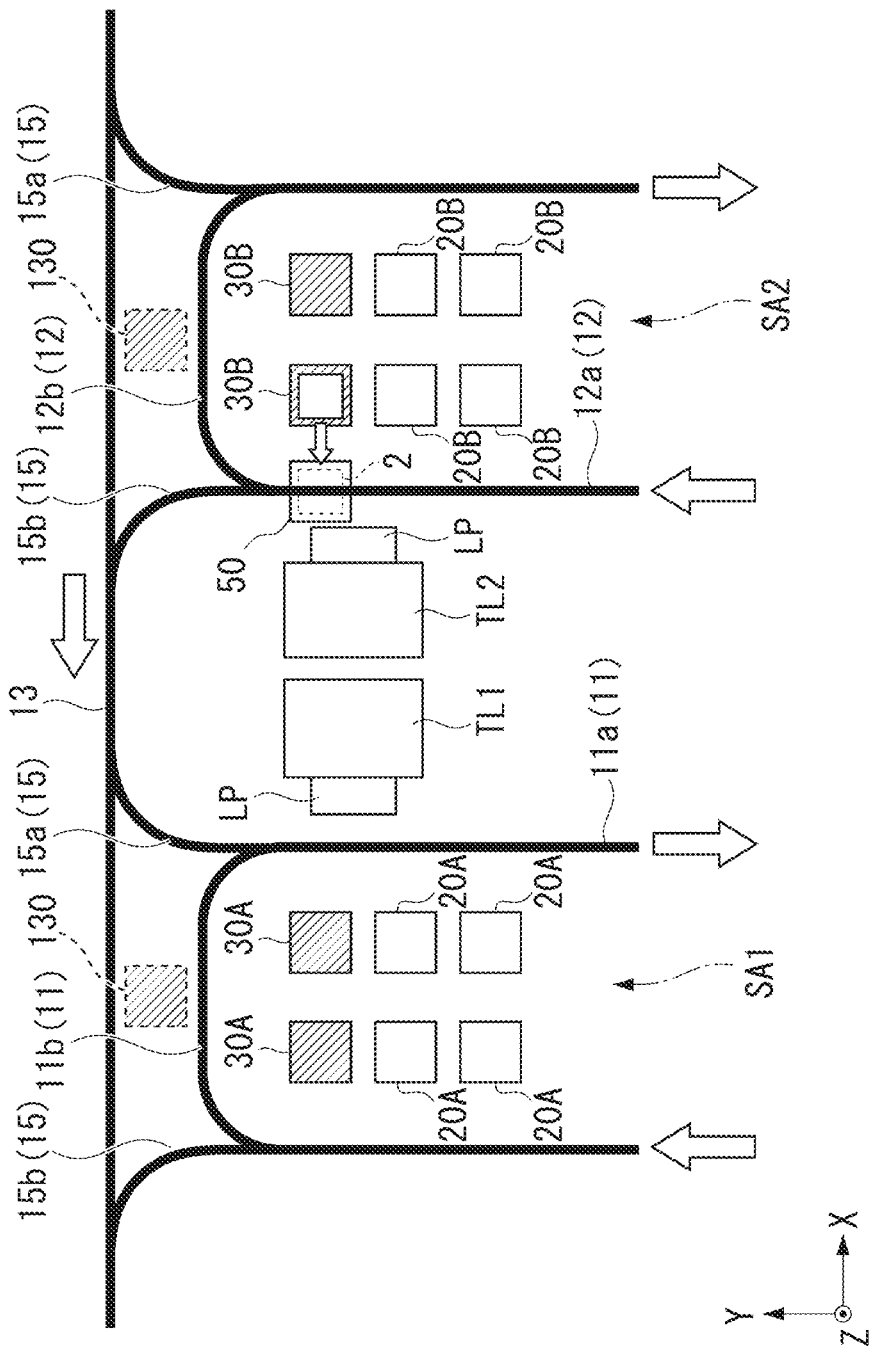
FIG. 7 is a diagram illustrating an example of a movement path to transport an article by the overhead transport vehicle.
Figure 8:
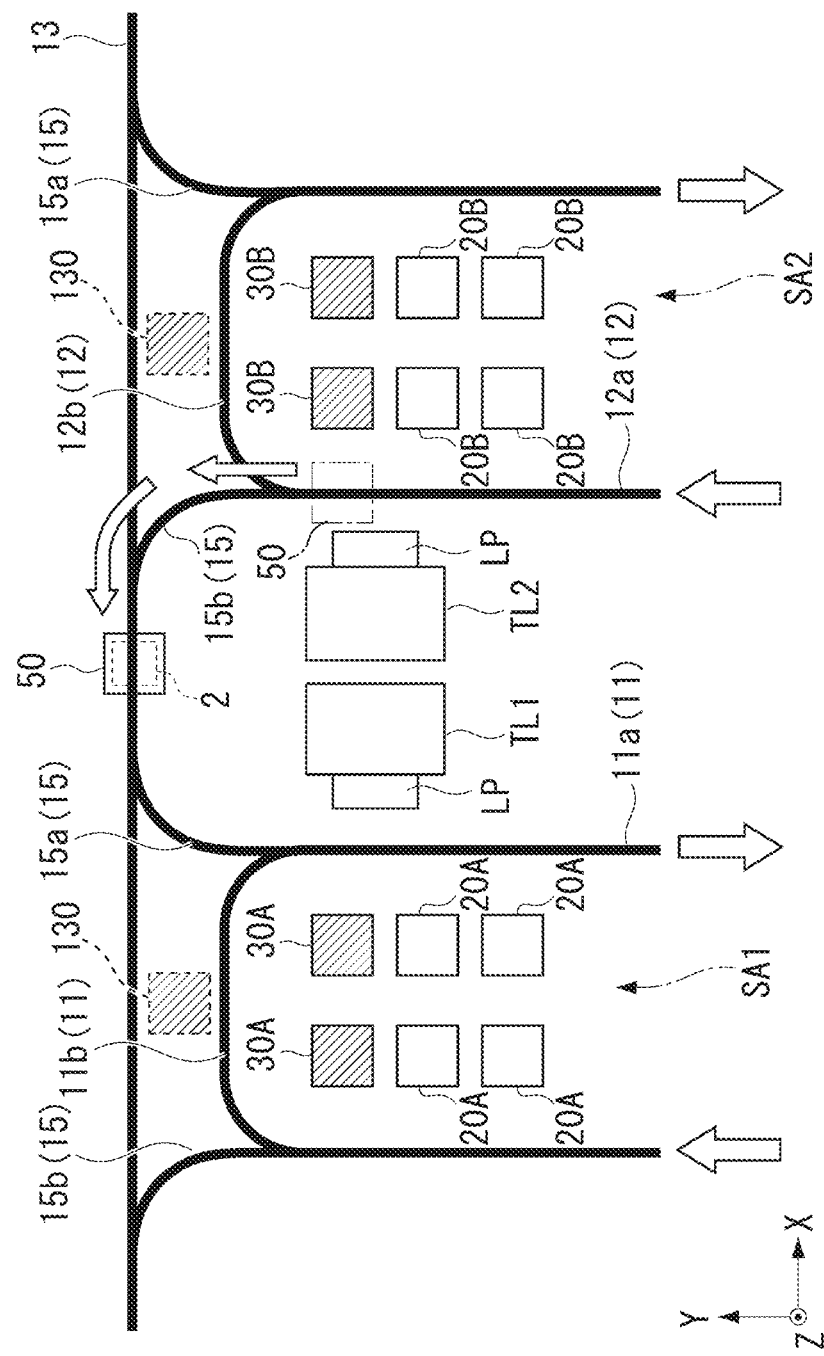
FIG. 8 is a diagram illustrating an example of a movement path to transport an article by the overhead transport vehicle subsequently to FIG. 7.
Figure 9:
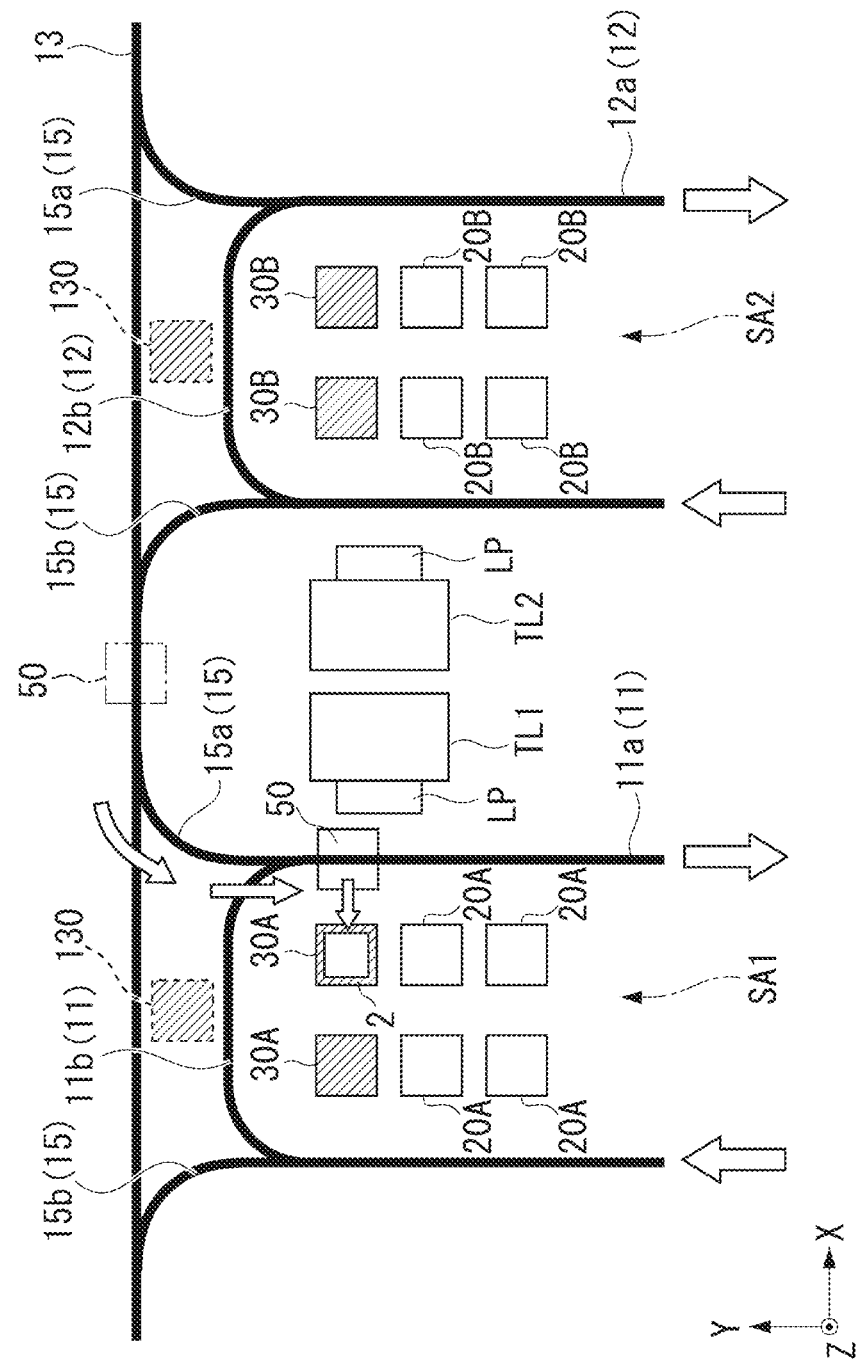
FIG. 9 is a diagram illustrating an example of a movement path to transport an article by the overhead transport vehicle subsequently to FIG. 8.

FIG. 7 to FIG. 9 are diagrams illustrating examples of movement paths to transport articles 2 by the overhead transport vehicle 50. FIG. 7 to FIG. 9 are examples where an article 2 whose next transport destination is the first storage area SA1 or the first tool area TA1 from the second storage area SA2 has been placed on the second delivery port 30B by the second crane 40B.

For example, as illustrated in FIG. 7, when an article 2 has been placed on a second delivery port 30B disposed at the +Y side end on the −X side in the second storage area SA2, the controller 60 (see FIG. 1) instructs the overhead transport vehicle 50 to transport the article 2 on the second delivery port 30B in the second storage area SA2 to the first delivery port 30A in the first storage area SA1. The overhead transport vehicle 50 moves to the second delivery port 30B along the second intrabay overhead track 12, controls the lateral extender 55 to protrude in the +X direction, and drives the lifting driver 54 to lower the holder 53, thus holding the article 2 on the second delivery port 30B by the holder 53. Based on information from the controller 60, the overhead transport vehicle 50 is informed that the transport destination of the received article 2 is the first delivery port 30A disposed at the +Y side end on the +X side in the first storage area SA1.

The second crane 40B and the overhead transport vehicle 50 circulate in the same direction, for example, the clockwise direction, in the second intrabay overhead track 12. As a result, the timing at which the second crane 40B and the overhead transport vehicle 50 interfere with each other and the timing at which the overhead transport vehicles 50 interfere with each other is able to be reduced.

Although there are cases where the second crane 40B or another overhead transport vehicle 50 runs or is stopped on the second intrabay overhead track 12, the interference with the second crane 40B or another overhead transport vehicle 50 can be avoided by a proximity sensor provided in the overhead transport vehicle 50. When the second crane 40B or another overhead transport vehicle 50 is present in the running direction of the overhead transport vehicle 50, the controller 60 may instruct the second crane 40B or the other overhead transport vehicle 50 to circulate to secure the running of the overhead transport vehicle 50 that transports an article 2. Instead of circulating on the second intrabay overhead track 12, the second crane 40B or the other overhead transport vehicle 50 may move from the second intrabay overhead track 12 to the first interbay overhead track 13 or the second interbay overhead track 14 through the first connection track 15 or the second connection track 16.

Next, as illustrated in FIG. 8, the overhead transport vehicle 50 runs on the second intrabay overhead track 12 in the clockwise direction while holding the article 2, and moves from the straight line 12a of the second intrabay overhead track 12 to the first interbay overhead track 13 through the exit 15b of the first connection track 15 (see arrows in FIG. 8). The cross-section of the second intrabay overhead track 12, the first connection track 15, and the first interbay overhead track 13 are identical or substantially identical to each other (see FIG. 6), and hence the overhead transport vehicle 50 can move from the second intrabay overhead track 12 to the first interbay overhead track 13 without any problem.

Next, as illustrated in FIG. 9, the overhead transport vehicle 50 runs on the first interbay overhead track 13 toward the −X direction, and moves from the first interbay overhead track 13 to the first intrabay overhead track 11 through the entrance 15a of the first connection track 15 (see arrows in FIG. 9). After that, the overhead transport vehicle 50 moves from the entrance 15a of the first connection track 15 to the straight line 11a of the first intrabay overhead track 11 and is stopped at a position corresponding to a first delivery port 30A at a transport destination. Subsequently, the overhead transport vehicle 50 controls the lateral extender 55 to protrude in the −X direction and drives the lifting driver 54 to lower the holder 53, thus placing the article 2 onto the first delivery port 30A.

Through the operation described above, the article 2 can be transported from the second storage area SA2 to the first storage area SA1. As described above, by disposing the first and the second delivery ports 30A and 30B on the +Y side or −Y side ends in the first and the second storage areas SA1 and SA2, at the intermediate portion in the first and the second storage areas SA1 and SA2, the overhead transport vehicle 50 is able to avoid being stopped from delivering an article 2, and the operating range of the first and the second cranes 40A and 40B is able to be increased.

For example, when an article 2 (whose transport destination is second delivery port 30B in second storage area SA2) has been placed on the first delivery port 30A in the first storage area SA1 by the first crane 40A, the controller 60 instructs the overhead transport vehicle 50 to transport the article 2 on the first delivery port 30A in the first storage area SA1 to the second delivery port 30B in the second storage area SA2. The overhead transport vehicle 50 runs to the first delivery port 30A along the first intrabay overhead track 11, controls the lateral extender 55 to protrude in the −X direction or the +X direction, and drives the lifting driver 54 to hold the article 2 on the first delivery port 30A by the holder 53. Based on information from the controller 60, the overhead transport vehicle receives positional information (address) of the second delivery port 30B in the second storage area SA2 as the transport destination of the received article 2.

Next, the overhead transport vehicle 50 runs in the clockwise direction about the first intrabay overhead track 11 while holding the article 2, and moves from the straight line 11a of the first intrabay overhead track 11 to the second interbay overhead track 14 through the exit 16b (see FIG. 1) of the second connection track 16. The cross-section of the second connection track 16 is identical or substantially identical to those of the first intrabay overhead track 11 and the second interbay overhead track 14 (see FIG. 6), and hence the overhead transport vehicle 50 can move from the first intrabay overhead track 11 to the second interbay overhead track 14 without any problem.

Next, the overhead transport vehicle 50 runs on the second interbay overhead track 14 toward the +X direction and moves from the second interbay overhead track 14 to the second intrabay overhead track 12 through the entrance 16*a* of the second connection track 16. After that, the overhead transport vehicle 50 circulates on the second intrabay overhead track 12 and is stopped at a position corresponding to a second delivery port 30B at a transport destination. Subsequently, the overhead transport vehicle 50 controls the lateral extender 55 to protrude in the +X direction or the −X direction and drives the lifting driver 54 to place the article 2 on the second delivery port 30B by the holder 53. Through the operation described above, the article 2 can be transported from the first storage area SA1 to the second storage area SA2.

In the above-mentioned preferred embodiments, examples where articles 2 are transported between the first storage area SA1 and the second storage area SA2 have been described. Articles 2 can be transported between the first storage area SA1 and another storage area or between the second storage area SA2 and another storage area by operation similar to the above-mentioned operation. The above description applies to the fact that an article 2 placed on a delivery port in another storage area is transported to a storage or a load port in a processing tool by a crane present in the storage area.

As described above, in the transport system 100 according to the present preferred embodiment, the first and the second cranes 40A and 40B can raise and lower the first and the second lifting bases 43A and 43B while running, and hence the time required to transfer articles 2 can be reduced as compared with an overhead transport vehicle 50 that needs to raise or lower the holder 53 after being stopped, and the transport efficiency of articles 2 in bays (in first and second storage areas SA1 and SA2) can be improved. By transporting articles 2 in the bays by the first and the second cranes 40A and 40B, the number of stored articles 2 can be increased. The overhead transport vehicle 50 has no member that hangs down therefrom such as the first and the second masts 42A and 42B of the first and the second cranes 40A and 40B and can move faster than the first and the second cranes 40A and 40B. Thus, by performing the transport of articles 2 between bays (for example, between first storage area SA1 and second storage area SA2) by the overhead transport vehicle 50, the articles 2 can be transported in a short period of time. In this manner, different roles are allocated to the first and the second cranes 40A and 40B and the overhead transport vehicle 50, and hence the transport efficiency of articles 2 in the entire transport system 100 is greatly improved. The first intrabay overhead track 11 is shared by the first crane 40A and the overhead transport vehicle 50, and the second intrabay overhead track 12 is shared by the second crane 40B and the overhead transport vehicle 50, and hence it is unnecessary to provide an overhead track separately, and the cost required to provide and install the overhead track 10 is significantly reduced.

The overhead transport vehicle 50 can run on the first intrabay overhead track 11 and the second interbay overhead track 14, and hence as indicated by the chain line in FIG. 5, articles 2 can be delivered between the load ports LP in the first and the second processing tools TL1 and TL2. As a result, upon occurrence of such situations as a failure of the first or the second crane 40A or 40B and a busy state of the first or the second crane 40A or 40B that is transporting another article 2, the delivery of an article 2 to the load port LP can be temporarily performed by the overhead transport vehicle 50, and hence the reduction in transport efficiency can be prevented. When there is an empty load port LP at a transport destination of an article 2 that has been transported from another area (article 2 can be transported), the overhead transport vehicle 50 transports the article 2 to the load port LP at the transport destination directly. Consequently, the transport efficiency of the article 2 is greatly improved.

In the above-mentioned preferred embodiments, the configuration in which the shelfs in the first and the second storages 20A and 20B and the first and the second delivery ports 30A and 30B are disposed in the first and the second storage areas SA1 and SA2 has been exemplified, but the preferred embodiments are not limited to this configuration. The storages and the delivery ports may be disposed outside the first and the second storage areas SA1 and SA2, for example.

Figure 10:
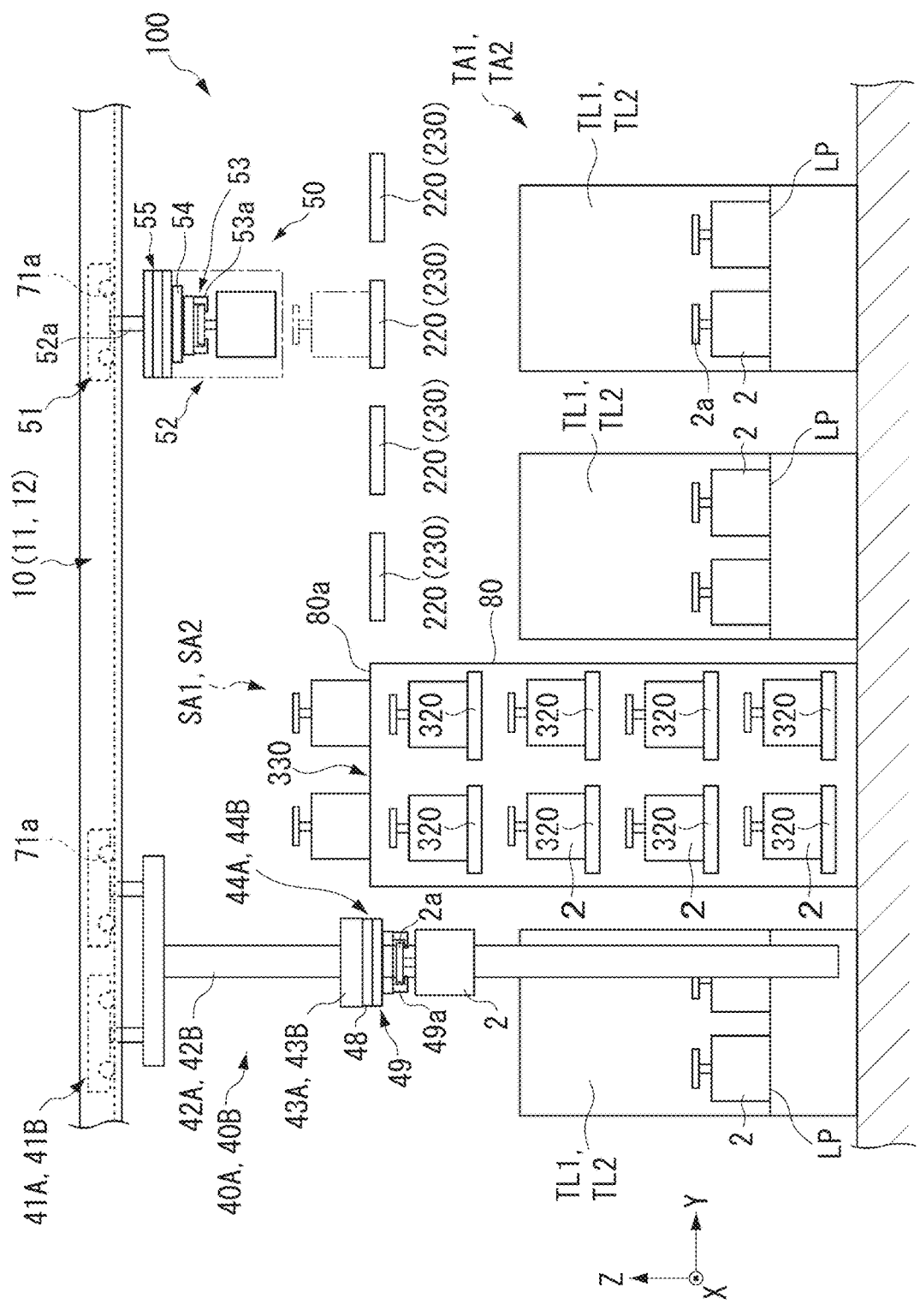
FIG. 10 is a diagram illustrating another example of storages and delivery ports.

FIG. 10 is a diagram illustrating another example of the storage and the delivery port. In the following description, the same or equivalent components as in the above-mentioned preferred embodiments are denoted by the same reference symbols, and descriptions thereof are omitted or simplified. As illustrated in FIG. 10, a storage 220 (or delivery port 230) may be disposed above a load port LP in a first or a second processing tool TL1 or TL2 in a first or a second tool area TA1 or TA2. This configuration enables the space above the load port LP to be effectively used as a storage area. Both the first and the second cranes 40A and 40B and the overhead transport vehicle 50 can deliver articles 2 to the storage 220 (or delivery port 230). Note that, in this configuration, the overhead transport vehicle 50 cannot directly deliver an article 2 to the load port LP. On the other hand, the first and the second cranes 40A and 40B can deliver an article 2 to the load port LP.

As illustrated in FIG. 10, a storage shelf 80 may be provided between the first and the second processing tools TL1 and TL2 and the first and the second processing tools TL1 and TL2. In the storage shelf 80, a plurality of storages 320 are provided in the vertical direction and the left-right direction (Y direction), and a delivery port 330 is provided at a top surface 80*a* thereof. This configuration enables the space between the first and the second processing tools TL1 and TL2 to be effectively used as a storage area. The first and the second cranes 40A and 40B can deliver an article 2 to the storage 320 in the storage shelf 80. Both the first and the second cranes 40A and 40B and the overhead transport vehicle 50 can deliver an article 2 to the delivery port 330 at the top surface 80*a* of the storage shelf 80. The first and the second cranes 40A and 40B can transport an article 2 between the storage 220 and the storage 320. FIG. 10 illustrates an example where both the storage 220 and the storage shelf 80 are provided. Instead of this configuration, the storage 220 is not necessarily required to be provided above the load port LP, and the storage shelf 80 may be provided between the first and the second processing tools TL1 and TL2 and the first and the second processing tools TL1 and TL2 (or between the load port LP and the load port LP). For example, the storage shelf 80 may be provided between the first processing tool TL1 and the first processing tool TL1 or between the second processing tool TL2 and the second processing tool TL2 (or between the load port LP and the load port LP) illustrated in FIG. 1. Similarly to the above, this configuration enables the space formed between the first and the second processing tools TL1 and TL2 (between the load ports LP) to be effectively used as a storage area.

In this manner, by disposing the storage 220 and the storage shelf 80 including the storage 320, the number of stored articles 2 can be easily increased in the transport system 100. In the transport system 100, the number of the storages 220 or the storage shelfs 80 installed can be freely set.

While the preferred embodiments have been described, the present invention is not limited to the above description and can be variously changed within the range not departing from the gist of the present invention. For example, in the above-mentioned transport system 100, a stocker (automatic warehouse) may be disposed in a movement path of the overhead transport vehicle 50. For example, the stocker may be installed on one or both of the first interbay overhead track 13 and the second interbay overhead track 14. The overhead transport vehicle 50 can deliver an article 2 to a delivery port in the stocker, and, for example, an article 2 may be transported between the stocker and the first and the second delivery ports 30A and 30B. Unless otherwise permitted by the law, contents in Japanese Patent Application No. 2017-128570 and all documents cited herein are hereby incorporated by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
    a first intrabay overhead track offset from immediately above a load port in a first processing tool and alongside the load port in the first processing tool;
    a second intrabay overhead track offset from immediately above a load port in a second processing tool and alongside the load port in the second processing tool;
    an interbay overhead track that connects the first intrabay overhead track and the second intrabay overhead track;
    first storages and second storages provided below and lateral to the first intrabay overhead track and the second intrabay overhead track, respectively, and positioned along a vertical direction in a plurality of stages to store therein an article;
    a first delivery port and a second delivery port provided below and lateral to the first intrabay overhead track and the second intrabay overhead track, respectively;
    a first crane including a first runner that runs along the first intrabay overhead track, a first mast that hangs down from the first runner, and a first transferor to be guided by the first mast and be raised and lowered, to transport an article between the load port in the first processing tool, the first storage, and the first delivery port;
    a second crane including a second runner that runs along the second intrabay overhead track, a second mast that hangs down from the second runner, and a second transferor to be guided by the second mast and be raised and lowered, to transport an article between the load port in the second processing tool, the second storage, and the second delivery port; and
    an overhead transport vehicle including a runner that runs along the first intrabay overhead track, the second intrabay overhead track, and the interbay overhead track, a holder that holds an article, a lifting driver that raises and lowers the holder while suspending the holder, and a lateral extender that controls the lifting driver to protrude laterally, to transport an article between the first delivery port and the second delivery port.

2. The transport system according to claim 1, wherein the crane is a suspension crane.

3. The transport system according to claim 1, wherein
    the first intrabay overhead track and the second intrabay overhead track are circling tracks;
    the first crane and the overhead transport vehicle circulate on the first intrabay overhead track in a same direction; and
    the second crane and the overhead transport vehicle circulate on the second intrabay overhead track in a same direction.

4. The transport system according to claim 1, wherein the first delivery port and the second delivery port are disposed at top stages of the first storages and the second storages, respectively.

5. A transport method for a transport system, the transport system including a first intrabay overhead track offset from immediately above a load port in a first processing tool and alongside the load port in the first processing tool, a second intrabay overhead track offset from immediately above a load port in a second processing tool and alongside the load port in the second processing tool, an interbay overhead track that connects the first intrabay overhead track and the second intrabay overhead track, first storages and second storages provided below and lateral to the first intrabay overhead track and the second intrabay overhead track, respectively, and positioned along a vertical direction in a plurality of stages to store therein an article, a first delivery port and a second delivery port provided below and lateral to the first intrabay overhead track and the second intrabay overhead track, respectively, a first crane including a first runner that runs along the first intrabay overhead track, a first mast that hangs down from the first runner, and a first transferor to be guided by the first mast and be raised and lowered, a second crane including a second runner that runs along the second intrabay overhead track, a second mast that hangs down from the second runner, and a second transferor to be guided by the second mast and be raised and lowered, and an overhead transport vehicle including a runner that runs along the first intrabay overhead track, the second intrabay overhead track, and the interbay overhead track, a holder that holds an article, a lifting driver that raises and lowers the holder while suspending the holder, and a lateral extender that controls the lifting driver to protrude laterally, the transport method comprising:
    transporting, by the first crane, an article between the load port in the first processing tool, the first storage, and the first delivery port;
    transporting, by the second crane, an article between the load port in the second processing tool, the second storage, and the second delivery port; and
    transporting, by the overhead transport vehicle, an article between the first delivery port and the second delivery port.

* * * * *